United States Patent
Karner et al.

(10) Patent No.: US 6,703,081 B2
(45) Date of Patent: Mar. 9, 2004

(54) INSTALLATION AND METHOD FOR VACUUM TREATMENT OR POWDER PRODUCTION

(75) Inventors: Johann Karner, Feldkirch (AT); Mauro Pedrazzini, Eschen (LI)

(73) Assignee: Unaxis Balzers Aktiengesellschaft, Balzers (LI)

( * ) Notice: Subject to any disclaimer, the term of this patent is extended or adjusted under 35 U.S.C. 154(b) by 0 days.

(21) Appl. No.: 10/045,855

(22) Filed: Jan. 11, 2002

(65) Prior Publication Data
US 2002/0114898 A1 Aug. 22, 2002

Related U.S. Application Data

(63) Continuation of application No. PCT/CH00/00364, filed on Jul. 4, 2000.

(30) Foreign Application Priority Data

Jul. 13, 1999 (SZ) ................................. 1292/99

(51) Int. Cl.[7] ............................ H05H 1/24; H05H 1/48; C23C 14/14; C23C 14/56
(52) U.S. Cl. .................. 427/562; 427/563; 204/192.38
(58) Field of Search ................. 427/562, 563, 427/564, 580, 446, 450; 204/192.38

(56) References Cited

U.S. PATENT DOCUMENTS

| | | | | |
|---|---|---|---|---|
| 3,839,182 A | * | 10/1974 | Sager ..................... | 204/192.38 |
| 4,492,845 A | * | 1/1985 | Kljuchko et al. ...... | 204/192.38 |
| 4,929,321 A | * | 5/1990 | Buhl ..................... | 204/192.38 |
| 5,340,621 A | * | 8/1994 | Matsumoto et al. ........ | 427/571 |
| 5,380,420 A | * | 1/1995 | Tsuji ..................... | 204/192.38 |
| 5,580,429 A | * | 12/1996 | Chan et al. ............. | 204/192.38 |
| 5,709,784 A | * | 1/1998 | Braendle ................ | 204/192.38 |
| 5,753,045 A | * | 5/1998 | Karner et al. ............... | 118/723 |
| 6,045,667 A | * | 4/2000 | Moll ..................... | 204/192.38 |

FOREIGN PATENT DOCUMENTS

| | | |
|---|---|---|
| DE | 4310286 A1 | 10/1993 |
| EP | 0724026 A1 | 7/1996 |

OTHER PUBLICATIONS

"Nanoparticle Formation Using a Plasma Expansion Process" Plasma Chemistry & Plasma Processing, vol. 15, No. 4, 1995, Dec., Rao et al, pp. 581–605.

* cited by examiner

*Primary Examiner*—Marianne Padgett
(74) *Attorney, Agent, or Firm*—Notaro & Michalos P.C.

(57) ABSTRACT

Vacuum treatment installation with a vacuum treatment chamber containing a plasma discharge configuration as well as a gas supply configuration. The plasma discharge configuration has at least two plasma beam discharge configurations with substantially parallel discharge axes and a deposition configuration is positioned along a surface which extends at predetermined distances from the beam axes and along a substantial section of the longitudinal extent of the discharge beam.

25 Claims, 5 Drawing Sheets

INSTALLATION AND METHOD FOR VACUUM TREATMENT OR POWDER PRODUCTION

This is a continuation of Internation Appl. No. PCT/CH00/00364 filed Jul. 4, 2000.

FIELD AND BACKGROUND OF THE INVENTION

The present invention builds on a method for vacuum treatment or on a method for producing powder.

According to the present invention a vacuum treatment installation is obtained, as well as used.

The present invention, in principle, has the objective of reactively depositing plasma-enhanced, i.e. through a PECVD method, materials on a deposition surface, be these materials which generally are extremely difficult to produce, namely metastable materials such as cBN, $\alpha$-$Al_2O_3$, $C_3N_4$ or, in particular, diamond materials, or basically materials at maximally high deposition rates and at maximally low temperatures, in particular when Si-containing compounds, further particularly microcrystalline $\mu$C—Si:H, are to be deposited.

EP 0 724 026 by the same applicant as the present invention, corresponding to U.S. Pat. No. 5,753,045, discloses a method for the vacuum treatment of at least one workpiece, in which the workpiece is exposed in a vacuum atmosphere to a reactive gas excited by means of a plasma discharge. The workpiece surfaces to be coated are disposed offset with respect to the plasma beam axis such that thereon a plasma density obtains of maximally 20% of the maximum density obtaining in the plasma beam axis. This procedure permits deposition layers difficult of production, in particular those comprising metastable materials in particular of diamond, cBN, $\alpha$-$Al_2O_3$ or $C_3N_4$. With respect to the definition of "metastable materials", reference is made to "Lehrbuch der anorganischen Chemie", Hohlemann-Wiberg, Walter Gruyer, Berlin, N.Y. 1976, Edition 81–90, p. 183 ff, which is to say materials which are deposited in a slightly reversible reaction.

According to the Swiss Patent Application 794/99 by the same applicant as the present invention, it has been recognized that said method—according to EP 0 724 026—surprisingly is also suitable for high-rate coating of surfaces, on the one hand, and for generating powder or cluster-form material on a collection surface, on the other hand.

Of disadvantage in these prior known processes is that therewith, on the one hand, only workpiece surfaces of relatively small, in particular planar, dimensions can be homogeneously treated, in particular coated, but that, on the other hand, it would be entirely desirable to increase the quantity of powder or clusters generated per unit time. Consequently, it would be desirable to realize, in particular for diamond coating, a relatively large-area, uniform layer thickness distribution also at maximally high coating rates.

SUMMARY OF THE INVENTION

The objective of the present invention is to attain such.

For this purpose the method according to the invention for the treatment of workpieces—also as a basis for the installation according to the invention is distinguished because, in the vacuum atmosphere, at least two plasma beams with substantially parallel beam axes are generated and the at least one workpiece surface to be treated is disposed along a surface in the vacuum atmosphere on which the plasma density distribution, predetermined by the plasma beams, is generated. The method for production according to the invention is, on the other hand, distinguished in that in the vacuum atmosphere at least two plasma beams are generated with substantially parallel beam axes and a collection surface for the powder is disposed in the vacuum atmosphere such that on it a plasma density distribution predetermined by the plasma beams is generated.

It was found that in the prior known approach, in particular due to its cylindrical symmetry with respect to the axis of the one plasma beam, complex dependencies result of the concentration of reactive species on the radial distance from the beam axis. If in particular the local concentration, of critical importance for the generation of diamond material, of atomic hydrogen in the prior known approach and as a function of the radial distance from the plasma beam axis is considered, a model calculation according to FIG. 1 shows the concentration decrease with increasing radial distance, with the assumption of a linear distance dependence according to (a) and with the assumption of a quadratic distance dependence according to (b).

As explained, in FIG. 1 the concentration function is depicted along a plane E which is at a distance $X_{min}$ parallel to the plasma beam axis A and viewed along a straight line G in plane E perpendicular to the beam axis A. The distance measure is normalized with $X_{min}$, the concentration measure with respect to the maximum concentration on plane E at site S of distance $X_{min}$.

Based on this representation, the reason is evident of why the prior known procedure with respect to deposition rate distribution presents problems, especially with relatively large workpiece areas to be coated if the one workpiece surface under consideration, or the several workpieces, is (are) each not disposed with their corresponding surface in such a way that they are rotationally symmetric about the beam axis A.

These problems are significantly reduced through the method proposed according to the invention.

Definitions

In the present specification the expression "workpiece support surface" is used if, according to the invention a workpiece treatment, in particular coating, is being addressed. The expression "collection surface" is used if powder or cluster generation is being addressed. The general term "deposition surface or "deposition configuration" is used if a "workpiece support surface" as well as also a "collection surface" jointly are being addressed.

In an especially preferred embodiment of the method according to the invention, onto the deposition surface a metastable material is deposited, preferably cBN, $\alpha$-$Al_2O_3$, $C_3N_4$ or, especially preferred, diamond.

In a further preferred embodiment of the method according to the invention, a silicon compound is deposited onto the deposition surface preferably microcrystalline silicon $\mu$C—Si:H, and as a reactive gas silane is preferably employed.

In a preferred embodiment the plasma beams are realized as low-voltage arc discharges, highly preferred as high-current arc discharges, preferably by means of cold cathode discharges, but especially preferred by means of hot cathode discharges.

Further, the deposition surface is disposed in the vacuum atmosphere and with respect to the plasma beams such that along this surface predetermined minimum plasma density fluctuations occur. This is attained in particular thereby that along said deposition surface plasma densities of maximally 20% occur, preferably of maximally 10%, preferably even of maximally 5% of the plasma density maxima of the particular closest plasma beams, wherein further the plasma beams can be operated identically, i.e. in this case have substantially identical maximum plasma densities in their axes. But it is advantageous to optimize the plasma density distribution attained along deposition surfaces, for example of predetermined shape, through the specific tuning of the particular discharges, i.e. through the specific tuning of the beam-specific maximum plasma densities. For this purpose it is further proposed that the plasma beam discharges can be operated independently of one another, which opens the feasibility of carrying out said optimization specifically from case to case.

It was additionally and surprisingly found that with the proposed method a material deposition at very high deposition rates can be realized at temperatures at the deposition site of maximally 500° C. Accordingly, the methods according to the invention are preferably carried out such that by disposing the deposition surface such that the plasma density maxima obtaining on it are 20% of the closest beam plasma density maxima, a deposition rate on the deposition surface of minimally 400 nm/min is set up, preferably at said temperature of maximally 500° C.

In a further preferred embodiment, the plasma density distribution is tuned by means of at least one magnetic field parallel to the beam axis.

In a further preferred embodiment the plasma density distribution is tuned by means of at least one magnetic field parallel to the beam axes.

In a further preferred embodiment a gas flow is established substantially parallel to the beam axes.

In order to equalize even further the treatment effect, in particular the coating thickness distribution, on several workpieces to be treated, which can be of significance in particular in workpiece surface treatment, it is further proposed that the workpieces are rotated about axes of rotation and/or moved linearly at least approximately parallel to the beam axes, preferably in pendulum motions back and forth.

It was furthermore found that with the procedure according to the invention even further effectivity can be attained with respect to simultaneously treatable workpieces or deposited quantity of powder thereby that at least one first deposition surface is disposed between the plasma beams and at least a second deposition surface between the plasma beams and the wall of a treatment chamber with the vacuum atmosphere.

While, consequently, on the first deposition surface, which is between the plasma beams, material is deposited bilaterally, be that for obtaining powder or workpiece coating, on the second deposition surface material is deposited on only one side, be this again for obtaining powder or for treatment, such as in particular coating, of workpieces. With respect to workpieces, consequently, workpieces to be coated bilaterally or multilaterally, such as milling tools or drills, can be disposed along the first deposition surface, whereas workpieces, which require treatment, in particular coating, on only one side, such as indexable inserts, can be disposed along the second deposition surface. This increases decisively the efficiency of the method or of an installation provided for this purpose.

An installation according to the invention is now distinguished by the characterizing features of the invention and various embodiments of this installation are disclosed as well as, uses of this installation.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the following, the invention will be explained by example in conjunction with further FIG. s and examples. Therein depict.

DESCRIPTION OF THE PREFERRED EMBODIMENTS

Figure 2:
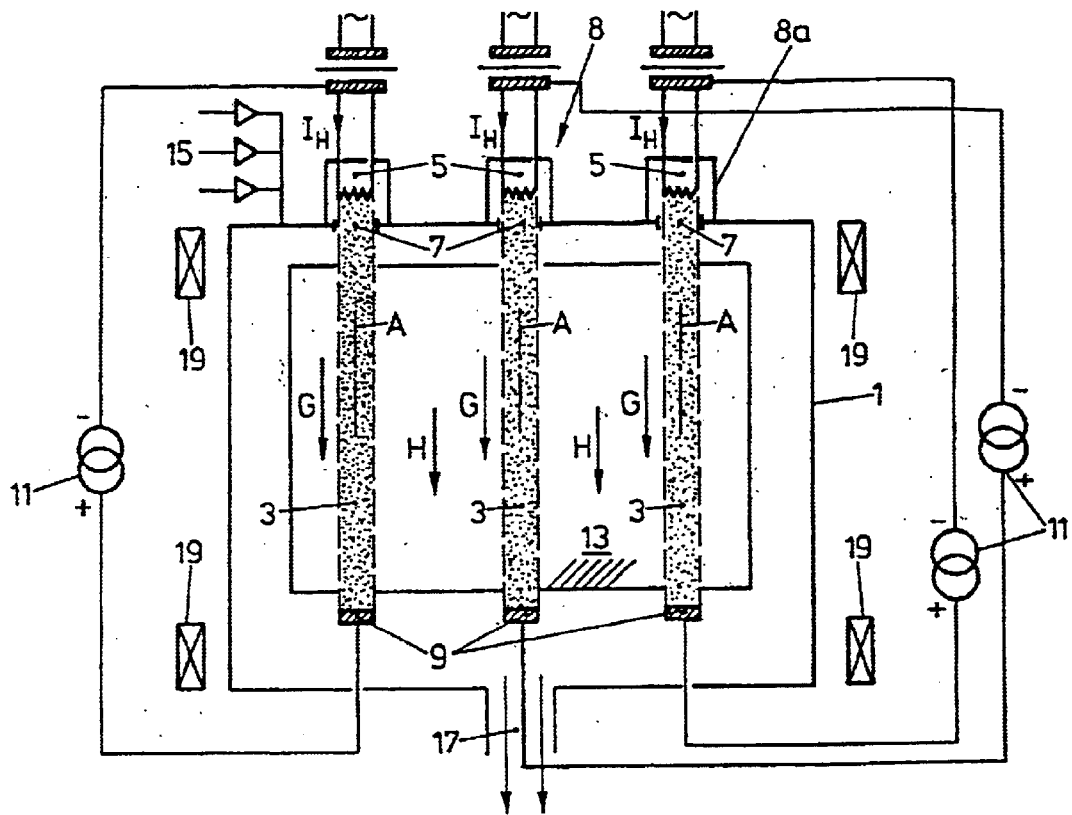
FIG. 2 is an installation according to the invention for carrying out the methods according to the invention schematically in side view.

FIG. 2 shows schematically in longitudinal section an installation according to the invention for carrying out the methods according to the invention.

The vacuum chamber 1 contains at least two or as in FIGS. 3 to 6 at least six, plasma beams 3. As also shown in FIG. 2, they are preferably formed by a high-current low-voltage discharge on corresponding discharge gaps, preferably in each instance with a hot cathode 5, heated directly or indirectly, as shown preferably heated directly via a heating current circuit with heating current $I_H$. The hot cathodes 5 are operated in a cathode chamber configuration 8, for example as shown in FIG. 2, with individual cathode chambers 8a, into which a working gas (not shown), such as for example argon, is allowed to flow, and which via nozzles 7 communicate with the interior of the chamber 1.

But, in principle, for generating the plasma beams other cathode types can also be employed, such as, for example, hollow cathodes if high-purity coatings are to be generated and the generation of impurities through sublimated hot cathode atoms is to be prevented.

In FIG. 2, reference numeral 9 further denotes the discharge gap anodes and 11 the discharge generators.

Preferably at least six plasma beams 3 are provided, in the configuration according to FIG. 2 of which three are evident. Deposition configurations along one or several surfaces 13, which extend at predetermined distances from the beam axes A are provided between the plasma beams 3, corresponding to the desired plasma density distributions on these surfaces 13 and thus on the deposition configuration. The deposition surfaces 13 are defined by workpiece support surfaces in the workpiece treatment according to the invention, for receiving one or several workpiece(s), or they are formed by collection surfaces, if, according to the invention, a powder or cluster generation is intended at these surfaces.

The reactive gas is allowed to flow into chamber 1 through a gas inlet configuration 15, consumed reactive gas is suctioned off at a pumping opening 17. As shown with G, a gas flow through the chamber 1 parallel to axes A of the plasma beams is preferably targeted.

By means of Helmholtz coils 19 in the chamber 1, further a magnetic field H is generated substantially parallel to beam axes A, by means of which the local plasma density distribution can additionally be tuned.

In FIGS. 3 to 6 in top view and schematically, the configurations of plasma beams 3 are depicted, with deposition surfaces 13 guided in between according to the invention and defined by workpiece support 13a or collection surfaces.

In FIG. 5, again in top view, a further configuration of six plasma beams 3 with deposition surface 13 is shown, which is guided such that on it bilaterally a desired plasma density distribution is effected, in this case with minimum inhomogenity.

Figure 5:
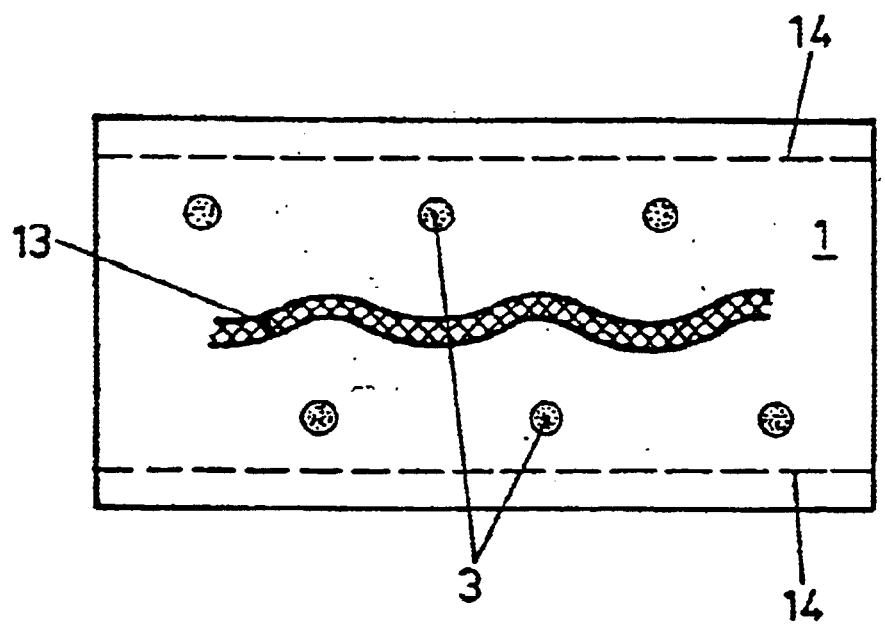

In FIG. 5, further, is shown in dashed lines the way in which, apart from the deposition surface 13, guided between the plasma beams 3, upon which action takes place bilaterally, between the plasma beams 3 and the recipient or chamber wall further deposition surfaces 14 can be disposed, which are only on one side exposed to the treatment. For the workpiece treatment are correspondingly provided on the one deposition surface 13 workpieces to be treated, in particular to be coated on two or all sides, on the deposition surfaces 13a only workpieces to be treated, in particular to be coated, on one side.

Figure 1:
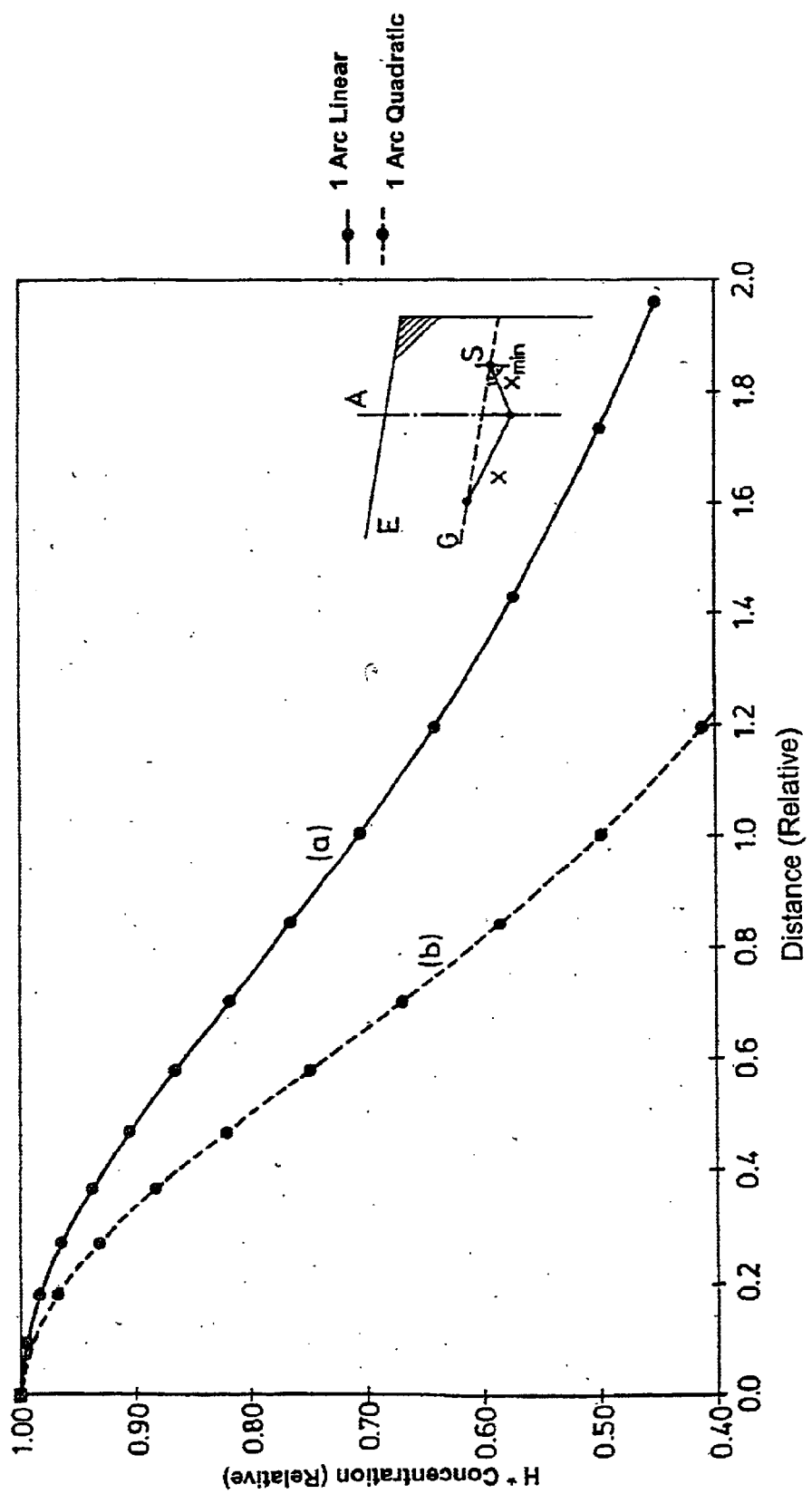
FIG. 1 shows the concentration decrease with increasing radial distance for atomic hydrogen according to a model calculation assuming the linear distance dependence in curve (a) and assuming quadratic distance dependence in curve (b).
Figure 7:
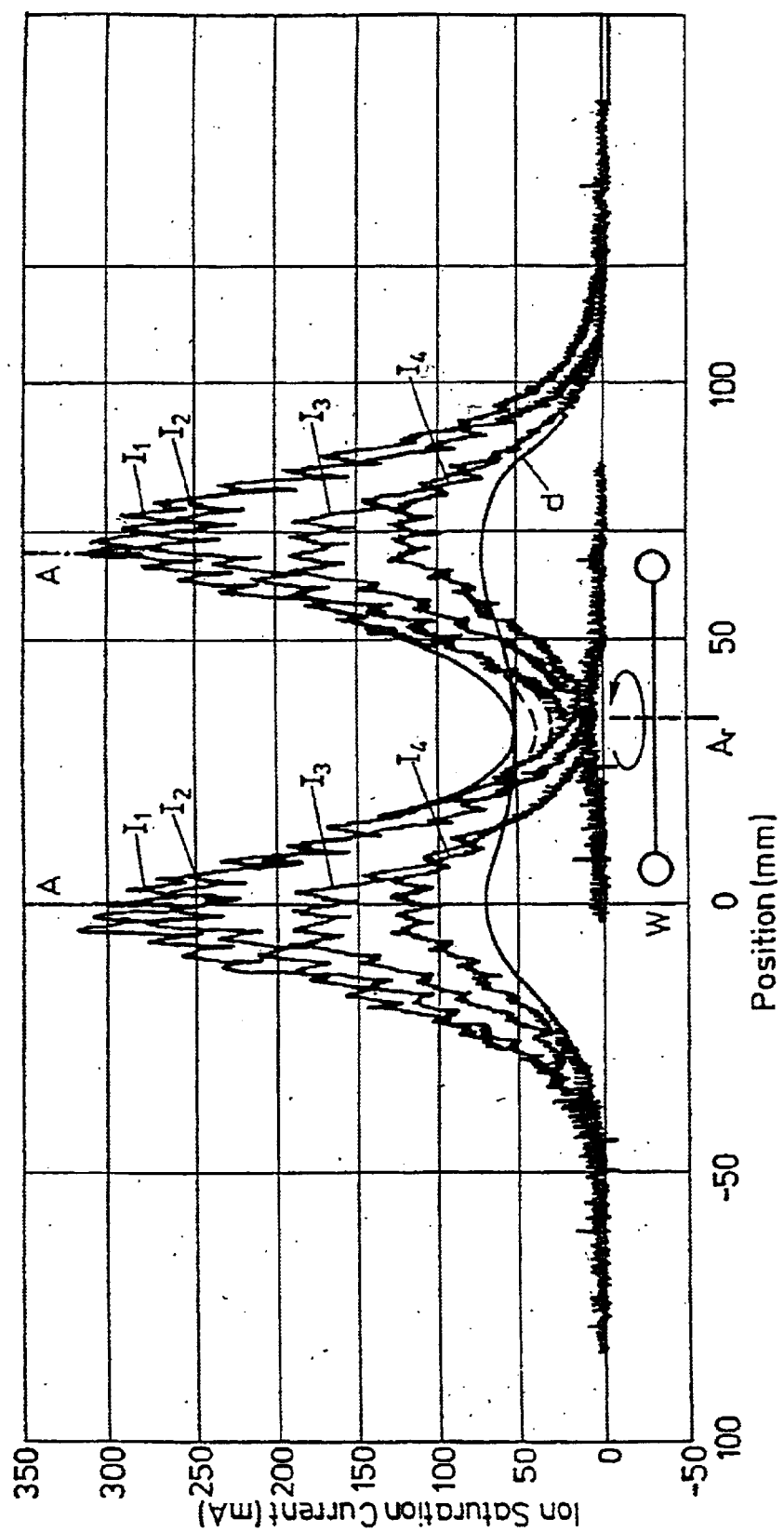
FIG. 7 shown a function of a measure of length along a straight line extending through the beam axis of two plasma beams, and perpendicular with respect to it, and parameterized with the heating current I of a hot cathode low voltage discharge, the plasma density distribution as well as (d) the plasma density distribution resulting on a planar deposition surface, parallel to and spaced apart from the beam axes.
Figure 8:
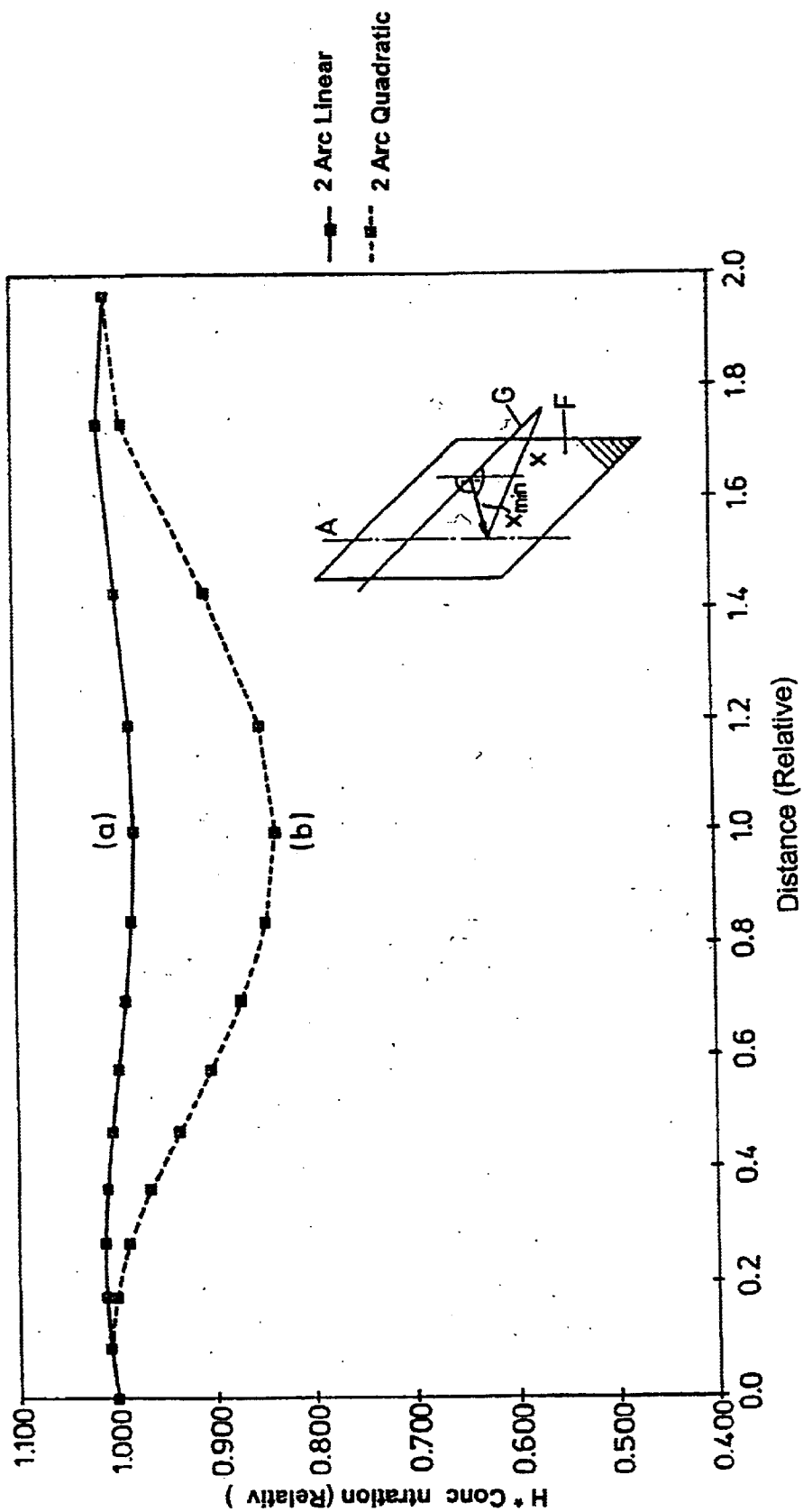
FIG. 8 in a representation analogous to FIG. 1, of the modeled plasma density distribution according to the invention along a planar deposition surface parallel to and spaced apart from two provided plasma beam axes.

In FIG. 7, as a function of the heating current I, the plasma density distribution is shown resulting from two plasma beams spaced apart. If a planar deposition surface is placed parallel to the plane of drawing of FIG. 7 into a region such that at this surface plasma density maxima occur of 20% of the maximum plasma densities obtaining in beam axis A, the plasma density distribution along this surface results, which is plotted qualitatively at d. In a depiction analogous to FIG. 1, such a plasma density distribution is shown modeled in FIG. 8, again at (a) with an assumed linear dependence of the plasma density on the arc axis distance x, at (b) with an assumed quadratic one.

The less the plasma density utilized at the provided deposition surfaces, relative to the maximum plasma density in beam axes A, the more homogeneous, i.e. equally distributed, becomes the plasma density distribution. But that simultaneously at only approximately 20% of the plasma density utilization nevertheless very high deposition rates of at least 400 nm/min at temperatures of maximally 500° C. can be attained, is surprising.

Figures 3, 4:
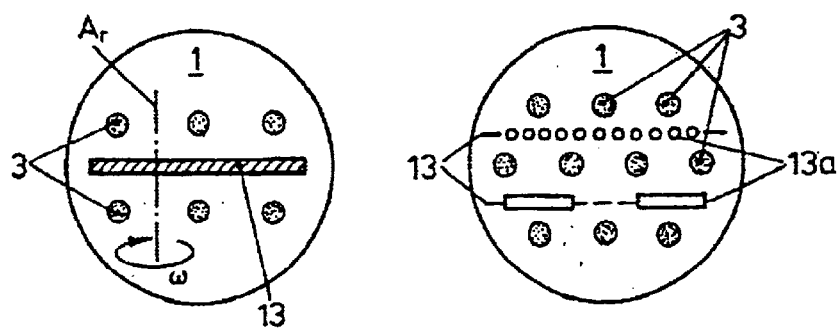
FIGS. 3 to 6 illustrate, again schematically, in top view, configurations according to the invention of plasma beams and deposition surfaces on installations according to the invention for carrying out the methods according to the invention.
Figure 6:
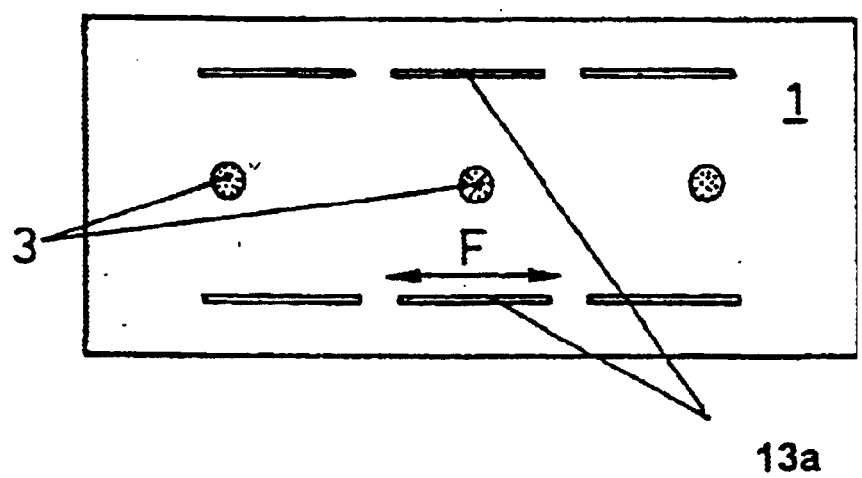

As depicted with ω in FIG. 3 and in FIG. 6 a further homogenation of the realized deposition distribution can be attained, in particular in coating, thereby that the workpieces are rotated about an axis Ar, preferably substantially perpendicularly to the beam axes A, and/or, as shown in FIG. 6, can be moved linearly along the beam axes depicted in FIG. 6 with the double arrow F.

As described in the introduction, with the introduced installations according to the invention or the methods according to the invention, it is made possible within the framework of a workpiece treatment, to deposit, on the one hand, difficult to produce layers, in particular diamond layers, over large areas with largely constant layer thickness distribution or to deposit with very high deposition rates and low temperatures reactive layers, in particular also layers comprised of silicon compounds, in particular of microcrystalline $\mu$C—Si:H, preferably employing silane as the reactive gas. But, on the other hand, it is also possible to deposit through the corresponding setting of the discharge parameters said materials as powder or clusters on said deposition surfaces.

What is claimed is:

1. A method for manufacturing vacuum-process-deposited material upon a surface, comprising the steps of:
   generating a plasma in the form of at least two plasma beams along respective, substantially parallel and spaced apart axes, said plasma extending in the direction of said axes;
   establishing a gas flow in said direction of said axes and along substantial parts of said axes;
   arranging said surface for receiving said vacuum-process-deposited material, parallel to said direction and along a two-dimensional locus of predetermined plasma density-distribution in said plasma caused by said at least two plasma beams; and
   depositing said material by said plasma upon said surface.

2. The method of claim 1, further comprising the steps of providing said surface as a surface of at least one workpiece and depositing said material upon said surface as a layer on said workpiece.

3. The method of claim 1, further comprising the step of depositing said material upon said surface as a powder.

4. The method of claim 1, wherein said material deposited upon said surface is a silicon compound.

5. The method of claim 1, wherein said material deposited upon said surface is microcrystalline silicon $\mu$C—Si:H.

6. The method of claim 5, wherein said gas is silane.

7. The method of claim 1, wherein said material deposited upon said surface is a metastable material.

8. The method of claim 1, wherein said material deposited upon said surface is selected from the group consisting of cBN, $\alpha$-$Al_2O_3$, $C_3N_4$ and diamond.

9. The method of claim 1, further comprising the step of generating said plasma beams by means of a low-voltage, high-current discharge.

10. The method of claim 9, further comprising the step of generating said low-voltage, high-current discharge by means of a cold cathode discharge.

11. The method of claim 9, further comprising the step of generating said low-voltage, high-current discharge by means of a hot cathode discharge.

12. The method of claim 1, further comprising the step of providing said surface along a locus whereat said plasma density-distribution has a minimum local variation.

13. The method of claim 1, further comprising the step of providing two fo said surfaces facing each other and situated on opposite sides of said plasma.

14. The method of claim 1, further comprising the steps of generating said plasma by means of at least four of said plasma beams and providing at least two of said surfaces in said plasma, one of said surfaces facing toward a first and a second of said at least four plasma beams and the other of said surfaces facing toward a third and a fourth of said at least four plasma beams.

15. The method of claim 1, further comprising the step of providing said surface along said locus so that the maximum plasma density along said surface is at most 20% of the maximum plasma density of said beams.

16. The method of claim 1, further comprising the step of providing said surface along said locus so that the maximum plasma density along said surface is at most 10% of the maximum plasma density of said beams.

17. The method of claim 1, further comprising the step of providing said surface along said locus so that the maximum plasma density along said surface is at most 5% of the maximum plasma density of said beams.

18. The method of claim 1, further comprising the step of generating said plasma beams to be independently controllable of one another.

19. The method of claim 1, further comprising the step of providing said surface along said locus so that the maximum plasma density along said surface is at most 20% of the maximum plasma density of said beams and depositing said material on said surface with a deposition rate of at least 400 nm/mm.

20. The method of claim 19, further comprising the step of maintaining the temperature along said surface to be at most 500° C.

21. The method of claim 1, further comprising the step of controlling the plasma density distribution in said plasma by adjusting a magnetic field generated in said plasma and parallel to said axes.

22. The method of claim 2, further comprising the step of rotating said workpiece during said depositing of said material.

23. The method of claim 2, further comprising the step linearly moving said workpiece during said depositing of said material.

24. The method of claim 23, further comprising the step of linearly moving said workpiece at least one of parallel to said axes and perpendicular to said axes.

25. The method of claim 23, further comprising the step of linearly moving said workpiece in an oscillating, back-and-forth manner.

* * * * *